United States Patent
Chen et al.

(10) Patent No.: US 11,863,134 B2
(45) Date of Patent: Jan. 2, 2024

(54) BALANCED RADIO FREQUENCY POWER AMPLIFIER, CHIP AND COMMUNICATION TERMINAL

(71) Applicants: Gang Chen, Shanghai (CN); Yunfang Bai, Shanghai (CN)

(72) Inventors: Gang Chen, Shanghai (CN); Yunfang Bai, Shanghai (CN)

(73) Assignee: SHANGHAI VANCHIP TECHNOLOGIES CO., LTD., Shanghai (CN)

(*) Notice: Subject to any disclaimer, the term of this patent is extended or adjusted under 35 U.S.C. 154(b) by 122 days.

(21) Appl. No.: 17/027,708

(22) Filed: Sep. 22, 2020

(65) Prior Publication Data
US 2022/0190793 A1    Jun. 16, 2022

Related U.S. Application Data

(63) Continuation of application No. PCT/CN2019/079012, filed on Mar. 21, 2019.

(30) Foreign Application Priority Data

Mar. 22, 2018 (CN) .......................... 201810241378.9

(51) Int. Cl.
*H03F 3/193* (2006.01)
*H03F 3/213* (2006.01)
*H03F 3/60* (2006.01)

(52) U.S. Cl.
CPC ............. *H03F 3/193* (2013.01); *H03F 3/213* (2013.01); *H03F 3/602* (2013.01); *H03F 2200/18* (2013.01)

(58) Field of Classification Search
CPC .......... H03F 3/193; H03F 3/213; H03F 3/602; H03F 2200/18
(Continued)

(56) References Cited

U.S. PATENT DOCUMENTS 5,614,863 A * 3/1997 Pierro ..................... H03F 3/245
330/306
6,650,180 B2 * 11/2003 Lautzenhiser .......... H03F 3/601
330/124 R (Continued)

FOREIGN PATENT DOCUMENTS

CN    101350599 A * 1/2009 .......... H03F 1/0266
CN    204089736 U * 1/2015
(Continued)

*Primary Examiner* — Hafizur Rahman
(74) *Attorney, Agent, or Firm* — George Guosheng Wang; Upstream Research and Patent LLC

(57) ABSTRACT

Disclosed in the present invention are a balanced radio frequency power amplifier, a chip and a communication terminal. The radio frequency power amplifier divides, by means of a 90-degree power splitter unit, a radio frequency input signal into two equal-amplitude signals having a phase difference of 90 degrees, the two radio frequency input signals are amplified and then inputted into an adjustable 90-degree power combiner, and the values of a adjustable capacitor and an adjustable resistor in the adjustable 90-degree power combiner are controlled by means of a control unit, so as to synthesize the two radio frequency input signals into one radio frequency input signal when the phase difference and amplitude difference of the two signals at different frequencies are the smallest, and to input the radio frequency input signal into a circuit of the next stage by means of a specific radio frequency transmission path.

18 Claims, 10 Drawing Sheets

(58) Field of Classification Search
USPC .......................................................... 330/295
See application file for complete search history.

(56) References Cited

U.S. PATENT DOCUMENTS

| | | | |
|---|---|---|---|
| 8,593,219 B1* | 11/2013 | Root | H03F 1/0288 |
| | | | 330/124 R |
| 9,876,475 B2* | 1/2018 | Ahmed | H04L 7/0079 |
| 10,491,176 B1* | 11/2019 | Hur | H03F 3/191 |
| 2006/0238245 A1* | 10/2006 | Carichner | H03F 1/3205 |
| | | | 330/136 |
| 2009/0179704 A1* | 7/2009 | Staudinger | H03F 3/602 |
| | | | 330/295 |
| 2011/0143821 A1* | 6/2011 | Hwang | H03F 1/223 |
| | | | 455/571 |
| 2014/0239813 A1* | 8/2014 | Van Zyl | H01J 37/32935 |
| | | | 315/111.21 |
| 2022/0376733 A1* | 11/2022 | Datta | H03F 3/26 |

FOREIGN PATENT DOCUMENTS

| | | | | |
|---|---|---|---|---|
| CN | 105490645 B | * | 6/2018 | |
| CN | 109660218 A | * | 4/2019 | ............... H03F 1/30 |
| EP | 1936803 A2 | * | 6/2008 | ............. H03F 3/602 |
| KR | 20090030896 A | * | 3/2009 | ............... H03F 3/20 |

* cited by examiner

BALANCED RADIO FREQUENCY POWER AMPLIFIER, CHIP AND COMMUNICATION TERMINAL

BACKGROUND

Technical Field

The present invention relates to a radio frequency power amplifier, and in particular, to a balanced radio frequency power amplifier supporting a mobile high-power user equipment (HPUE) function, also relates to an integrated circuit chip including the balanced radio frequency power amplifier and a corresponding communication terminal, and belongs to the technical field of radio frequency integrated circuits.

Related Art

Radio frequency power amplifiers are widely applied to wireless communication devices such as mobile phones. To meet an increasingly higher requirement of modern communications on a communication speed, various communication terminal devices need to improve technical indexes, to meet the requirement. For example, currently, a requirement on supporting a mobile high performance user equipment (HPUE) function for a Band41 (2496 MHz to 2690 MHz) frequency band is proposed in the current industry. Therefore, a linear power transmitted by a mobile terminal antenna needs to be increased to 26 dBm. Because a design area of a radio frequency antenna of a communication terminal is decreased, a gain of the radio frequency antenna is reduced, and a load impedance voltage standing wave ratio (VSWR) of the radio frequency antenna is increased. This requires a radio frequency power amplifier to output a higher linear power to meet a radio frequency index of the communication terminal.

In the related art, the method for improving the linear power of the radio frequency power amplifier of the communication terminal mainly includes two types: increasing an output voltage and increasing an output current. The increasing an output voltage is increasing a power supply voltage of an output end of the radio frequency power amplifier, so that a peak value of a waveform of the output voltage of the radio frequency power amplifier is increased, so as to improve the linear power of the radio frequency power amplifier. The increasing an output current is increasing an output current capability of the radio frequency power amplifier at maximum power.

The increasing a power supply voltage of the radio frequency power amplifier mainly includes two manners: constant increase and instantaneous increase. The advantages of the constant increase is that the implementations are simple, and a representative technology is average power tracking (APT), but the disadvantages are as follows: 1) A higher requirement is proposed on the ruggedness of a power tube; 2) a power supply booster needs to be additionally added to the communication terminal to increase the power supply voltage of the radio frequency power amplifier; and 3) power added efficiency of the radio frequency power amplifier at backoff power is reduced. The advantages of the instantaneous increase is that the power added efficiency of the radio frequency power amplifier at the backoff power is improved, and a representative technology is envelop tracking (ET), but the disadvantages are as follows: 1) A higher requirement is proposed on the ruggedness of the power tube; 2) the implementations are complex, and a baseband chip and a radio frequency front-end of the communication terminal need to work together; and 3) it is quite difficult to process higher-bandwidth radio frequency signals.

The increasing an output current of the radio frequency power amplifier mainly includes two manners: increasing an area of an output power tube and parallel connection of a plurality of power amplifiers. The advantages of increasing an area of an output power tube are that the implementations are simple, but a problem of an excessively large parasitic parameter is caused. The frequency band of Band41 that currently supports the HPUE function belongs to a higher frequency band, the performance of a high-frequency-band radio frequency power amplifier is deteriorated by the larger parasitic parameter, and linear power improvement of the high-frequency-band radio frequency power amplifier is limited. Compared with the increasing an area of a power tube, the parallel connection of a plurality of power amplifiers avoids the problem of an excessively large parasitic parameter, but cannot resolve an output power loss of the radio frequency power amplifier caused by an antenna load impedance change of the communication terminal.

SUMMARY

A primary technical problem to be resolved in the present invention is to provide a balanced radio frequency power amplifier.

Another primary technical problem to be resolved in the present invention is to provide an integrated circuit chip including the balanced radio frequency power amplifier and a corresponding communication terminal.

To achieve the objective of the present invention, the present invention adopts the following technical solutions:

According to a first aspect of embodiments of the present invention, a balanced radio frequency power amplifier is provided, including: a control unit, a first driver stage unit, a 90-degree power splitter unit, a first power stage unit, a second power stage unit, and an adjustable 90-degree power combiner unit, where the control unit is separately connected to the first driver stage unit, the first power stage unit, the second power stage unit, and the adjustable 90-degree power combiner unit, an input end of the first driver stage unit is connected to a radio frequency signal input end, an output end of the first driver stage unit is connected to an input end of the 90-degree power splitter unit, an output end of the 90-degree power splitter unit is separately connected to input ends of the first power stage unit and the second power stage unit, output ends of the first power stage unit and the second power stage unit are separately connected to an input end of the adjustable 90-degree power combiner unit, and an output end of the adjustable 90-degree power combiner unit is connected to a radio frequency transmission path; and a radio frequency input signal is inputted to the 90-degree power splitter unit after being amplified by the first driver stage unit, and the 90-degree power splitter unit divides the radio frequency input signal into two equal-amplitude radio frequency input signals that have a phase difference of 90 degrees, correspondingly inputs the two equal-amplitude radio frequency input signals to the first power stage unit and the second power stage unit to amplify, inputs the two equal-amplitude radio frequency input signals to the adjustable 90-degree power combiner unit, and controls the adjustable 90-degree power combiner unit by using the control unit, so that when the two equal-amplitude radio frequency input signals at different frequencies have a minimum phase difference and a minimum amplitude difference, the two radio frequency input signals are synthesized into one radio frequency input signal to be inputted to the radio frequency transmission path.

Preferably, the first driver stage unit is replaced with a second driver stage unit and a third driver stage unit, the second driver stage unit and the third driver stage unit are disposed between the 90-degree power splitter unit and the first power stage unit and the second power stage unit, and the input end of the 90-degree power splitter unit is connected to the radio frequency signal input end.

Preferably, a switch module unit is disposed between the adjustable 90-degree power combiner unit and the radio frequency transmission path, an input end of the switch module unit is connected to the output end of the adjustable 90-degree power combiner unit, and an output end of the switch module unit is separately connected to the radio frequency transmission path and a radio frequency receiving path.

The control unit is connected to the switch module unit, and is configured to: control a switch state of the switch module unit according to a frequency band requirement, and input, through a radio frequency transmission path corresponding to a frequency band, a radio frequency input signal outputted by the adjustable 90-degree power combiner unit to a next-stage circuit.

Preferably, any one of a Band7 duplexer, a Band38 filter, a Band40 filter, and a Band41 filter is disposed between the switch module unit and the radio frequency transmission path.

Preferably, the adjustable 90-degree power combiner unit includes a 90-degree phase shifter and a Wilkinson power combiner, the 90-degree phase shifter includes a phase lag impedance transformation network and a phase lead impedance transformation network, an input end of the phase lag impedance transformation network is connected to the output end of the first power stage unit, an output end of the phase lag impedance transformation network is connected to one input end of the Wilkinson power combiner, an input end of the phase lead impedance transformation network is connected to the output end of the second power stage unit, and an output end of the phase lead impedance transformation network is connected to the other input end of the Wilkinson power combiner.

Preferably, the phase lag impedance transformation network includes a first inductor, a first variable capacitor, and a second variable capacitor, one end of the first inductor is used as the input end of the phase lag impedance transformation network, to be connected to the output end of the first power stage unit, the other end of the first inductor is separately connected to one end of the first variable capacitor and one end of the second variable capacitor, the other end of the first variable capacitor is grounded, and the other end of the second variable capacitor is used as the output end of the phase lag impedance transformation network, to be connected to one input end of the Wilkinson power combiner.

Preferably, the phase lead impedance transformation network includes a third variable capacitor and a second inductor, one end of the third variable capacitor is used as the input end of the phase lead impedance transformation network, to be connected to the output end of the second power stage unit, the other end of the third variable capacitor is used as the output end of the phase lead impedance transformation network, to be separately connected to one end of the second inductor and the other input end of the Wilkinson power combiner, and the other end of the second inductor is grounded.

Preferably, the Wilkinson power combiner includes a fourth variable capacitor, a variable resistor, a fifth variable capacitor, a third inductor, a fourth inductor, and a sixth variable capacitor, one end of the fourth variable capacitor is used as one input end of the Wilkinson power combiner, to be separately connected to the output end of the phase lag impedance transformation network, an input end of the variable resistor, and one end of the third inductor, one end of the variable resistor is used as the other input end of the Wilkinson power combiner, to be separately connected to the output end of the phase lead impedance transformation network, one end of the fifth variable capacitor, and one end of the fourth inductor, the other end of the third inductor and the other end of the fourth inductor are used as the output ends of the adjustable 90-degree power combiner unit, to be respectively connected to one end of the sixth variable capacitor and the input end of the switch module unit, and the other ends of the fourth variable capacitor, the fifth variable capacitor, and the sixth variable capacitor are separately grounded.

Preferably, each variable capacitor in the adjustable 90-degree power combiner unit is formed by parallel connection of a capacitor and n groups of switched capacitors, or each variable capacitor in the adjustable 90-degree power combiner unit is formed by parallel connection of n groups of switched capacitors, and n is a positive integer.

Preferably, in the n groups of switched capacitors, each group of switched capacitors is formed by series connection of one capacitor and one switch, switches in the each group of switched capacitors are separately connected to the control unit, and the control unit switches a specified quantity of switches in the n groups of switched capacitors on or off, to obtain capacitances of corresponding switched capacitors.

Preferably, each variable capacitor in the adjustable 90-degree power combiner unit is formed by series connection of a capacitor and n groups of switched capacitors, or each variable capacitor in the adjustable 90-degree power combiner unit is formed by series connection of n groups of switched capacitors.

Preferably, in the n groups of switched capacitors, each group of switched capacitors is formed by parallel connection of one capacitor and one switch, switches in the each group of switched capacitors are separately connected to the control unit, and the control unit switches a specified quantity of switches in the n groups of switched capacitors on or off, to obtain capacitances of corresponding switched capacitors.

Preferably, each variable resistor in the adjustable 90-degree power combiner unit is formed by parallel connection of a resistor and n groups of switched resistors, or each variable resistor in the adjustable 90-degree power combiner unit is formed by parallel connection of n groups of switched resistors.

Preferably, in the n groups of switched resistors, each group of switched resistors is formed by series connection of one resistor and one switch, switches in each of the group of switched resistors are separately connected to the control unit, and the control unit switches a specified quantity of switches in the n groups of switched resistors on or off, to obtain resistances of corresponding switched resistors.

Preferably, each variable resistor in the adjustable 90-degree power combiner unit is formed by series connection of a resistor and n groups of switched resistors, or each variable resistor in the adjustable 90-degree power combiner unit is formed by series connection of n groups of switched resistors.

Preferably, in the n groups of switched resistors, each group of switched resistors is formed by parallel connection of one resistor and one switch, switches in the each group of switched resistors are separately connected to the control unit, and the control unit switches a specified quantity of switches in the n groups of switched resistors on or off, to obtain resistances of corresponding switched resistors.

Preferably, a first matching network is disposed in the 90-degree power splitter unit, and is configured to: implement impedance matching, and participate in matching the 90-degree power splitter unit to divide the radio frequency input signal into the two equal-amplitude radio frequency input signals that have the phase difference of 90 degrees.

Preferably, a second matching network is disposed in the adjustable 90-degree power combiner unit, and is configured to: implement impedance matching, and participate in matching the adjustable 90-degree power combiner unit, so that the two equal-amplitude radio frequency input signals have a minimum phase difference and a minimum amplitude difference at different frequencies.

Preferably, the adjustable 90-degree power combiner unit is replaced with a 90-degree power combiner unit with a non-adjustable structure, the 90-degree power combiner with a non-adjustable structure is a matching network and a phase-shift network built by inductors, capacitors and resistance devices, or the 90-degree power combiner with a non-adjustable structure is impedance and phase transformation networks built by metal coupled devices, or the 90-degree power combiner with a non-adjustable structure is impedance and phase transformation networks built for a transmission line network.

Preferably, the switch module unit includes n groups of transmit/receive switches, common ends of each group of transmit/receive switches are separately connected to the output end of the adjustable 90-degree power combiner unit, one output end of the each group of transmit/receive switches is respectively connected to a corresponding radio frequency transmission path, and the other output end of the each group of transmit/receive switches is respectively connected to a corresponding radio frequency receiving path.

According to a second aspect of the embodiments of the present invention, an integrated circuit chip is provided, including the foregoing balanced radio frequency power amplifier.

According to a third aspect of the embodiments of the present invention, a communication terminal is provided, including the foregoing balanced radio frequency power amplifier.

The balanced radio frequency power amplifier provided in the present invention divides, by using a 90-degree power splitter unit, a radio frequency input signal into two equal-amplitude signals that have a phase difference of 90 degrees, the two equal-amplitude radio frequency input signals are inputted to an adjustable 90-degree power combiner unit after being amplified, and a control unit controls values of adjustable capacitors and adjustable resistors in the adjustable 90-degree power combiner unit, so that when the two equal-amplitude radio frequency input signals at different frequencies have a minimum phase difference and a minimum amplitude difference, the two radio frequency input signals are synthesized into one radio frequency input signal to be inputted to a next-stage circuit through a specified radio frequency transmission path. Therefore, the balanced radio frequency power amplifier not only improves a maximum linear power of an output, but also reduces the sensitivity to a load change of a radio frequency antenna, thereby implementing support on a mobile HPUE function.

DETAILED DESCRIPTION

The technical content of the present invention is further described in detail below with reference to the accompanying drawings and specific embodiments.

The present invention provides a balanced radio frequency power amplifier configured to support related indexes of mobile high-power user equipment (HPUE), to improve a maximum output linear power of the radio frequency power amplifier and reduce the sensitivity of the radio frequency power amplifier to a load. The structure and the working principle of the balanced radio frequency power amplifier are described in detail below by using different embodiments.

Embodiment 1

Figure 1:
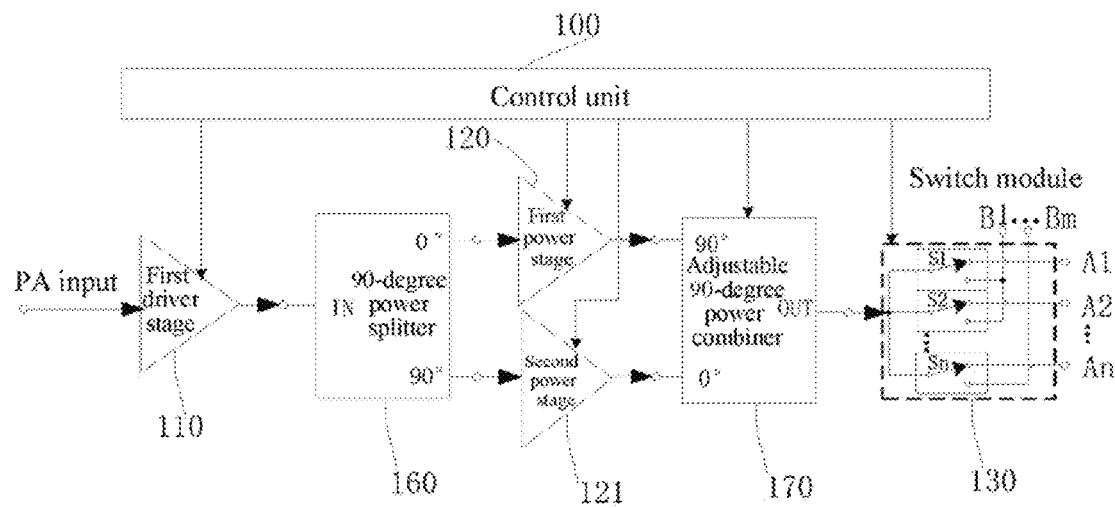
FIG. 1 is a schematic structural diagram 1 of a balanced radio frequency power amplifier according to Embodiment 1 of the present invention.

As shown in FIG. 1, a balanced radio frequency power amplifier provided in this embodiment includes a control unit 100, a first driver stage unit 110, a 90-degree power splitter unit 160, a first power stage unit 120, a second power stage unit 121, and an adjustable 90-degree power combiner unit 170, and a switch module unit 130. The control unit 100 is separately connected to the first driver stage unit 110, the first power stage unit 120, the second power stage unit 121, the adjustable 90-degree power combiner unit 170, and the switch module unit 130, and may be configured to control quiescent currents of the first driver stage unit 110, the first power stage unit 120, and the second power stage unit 121. An input end of the first driver stage unit 110 is connected to a radio frequency signal input end, an output end of the first driver stage unit 110 is connected to an input end of the 90-degree power splitter unit 160, an output end of the 90-degree power splitter unit 160 is separately connected to input ends of the first power stage unit 120 and the second power stage unit 121, output ends of the first power stage unit 120 and the second power stage unit 121 are separately connected to an input end of the adjustable 90-degree power combiner unit 170, an output end of the adjustable 90-degree power combiner unit 170 is connected to an input end of the switch module unit 130, and an output end of the switch module unit 130 is separately connected to a radio frequency transmission path (A1 to An) and a radio frequency receiving path (B1 to Bm), where m and n are positive integers.

When a radio frequency input signal enters the balanced radio frequency power amplifier, the radio frequency input signal is inputted to the first driver stage unit 110 through the radio frequency signal input end to amplify, and is inputted to the 90-degree power splitter unit 160 after being amplified by the first driver stage unit 110, and the 90-degree power splitter unit 160 divides the radio frequency input signal into two equal-amplitude radio frequency input signals that have a phase difference of 90 degrees (or approximately 90 degrees, which is the same below), correspondingly inputs the two equal-amplitude radio frequency input signals to the first power stage unit 120 and the second power stage unit 121 to amplify, correspondingly inputs the two equal-amplitude radio frequency input signals that are amplified by the first power stage unit 120 and the second power stage unit 121 to the adjustable 90-degree power combiner unit 170, and controls the adjustable 90-degree power combiner unit 170 by using the control unit 100, so that when the two equal-amplitude radio frequency input signals at different frequencies have a minimum phase difference and a minimum amplitude difference (preferably, the phase difference is 0 degrees or approximately 0 degrees, and the amplitude difference is 0 dBc or approximately 0 dBc), the two radio frequency input signals are synthesized into one radio frequency input signal to be inputted to the switch module unit 130. In this case, the control unit 100 control a switch state of the switch module unit 130 according to a frequency band requirement, and inputs the synthesized radio frequency input signal to a next-stage circuit through a specified radio frequency transmission path.

To input the radio frequency input signal that is amplified by the first driver stage unit 110 to the 90-degree power splitter unit 160 to the maximum extent, further participate in matching the 90-degree power splitter unit 160 to divide the radio frequency input signal into the two equal-amplitude radio frequency input signals that have the phase difference of 90 degrees, input the two equal-amplitude radio frequency input signals to the first power stage unit 120 and the second power stage unit 121 to the maximum extent to amplify, and reduce the design complexity of the balanced radio frequency power amplifier as much as possible, a first matching network may be disposed in the 90-degree power splitter unit 160, to implement impedance matching between the 90-degree power splitter unit 160 and the first driver stage unit 110, the first power stage unit 120, and the second power stage unit 121 respectively by using the first matching network.

Similarly, to input the radio frequency input signal that is amplified by the first power stage unit 120 and the second power stage unit 121 to the adjustable 90-degree power combiner unit 170 to the maximum extent, further participate in matching the adjustable 90-degree power combiner unit 170, so that the two equal-amplitude radio frequency input signals have a phase difference of 0 degrees or approximately 0 degrees, and an amplitude difference of 0 dBc or approximately 0 dBc at different frequencies, synthesize the two equal-amplitude radio frequency input signals into one radio frequency input signal to be inputted to the switch module unit 130 to the maximum extent, and reduce the design complexity of the balanced radio frequency power amplifier as much as possible, a second matching network may also be disposed in the adjustable 90-degree power combiner unit 170, to implement impedance matching between the adjustable 90-degree power combiner unit 170 and the first power stage unit 120, the second power stage unit 121, and the switch module unit 130 respectively by using the second matching network.

As shown in FIG. 1, the switch module unit 130 includes n groups of transmit/receive switches (single-pole double-throw switches S1 to Sn, where n is a positive integer). Common ends of each group of transmit/receive switches are separately connected to the output end of the adjustable 90-degree power combiner unit 170, one output end of each group of transmit/receive switches is respectively connected to a corresponding radio frequency transmission path, and the other output end of each group of transmit/receive switches is respectively connected to a corresponding radio frequency receiving path.

Figure 2:
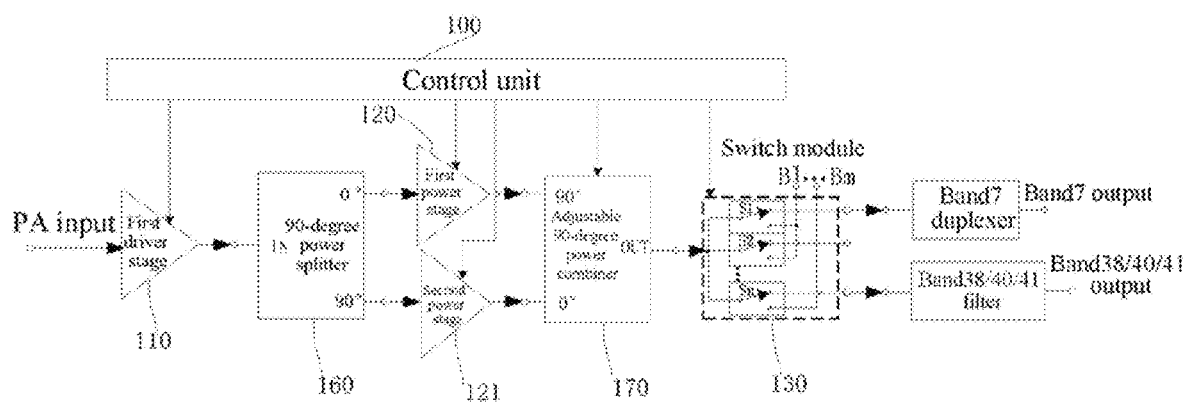
FIG. 2 is a schematic structural diagram 2 of a balanced radio frequency power amplifier according to Embodiment 1 of the present invention.

To reduce a package size of the balanced radio frequency power amplifier, optimize a match between integrated filter devices, and simplify a design of a communication terminal, any one of a Band1 duplexer, a Band38 filter, a Band40 filter, and a Band41 filter may be disposed between the switch module unit 130 and the radio frequency transmission path in this embodiment. For example, as shown in FIG. 2, the Band1 duplexer may be disposed between a first group of transmit/receive switches S1 and the radio frequency transmission path, and any one of the Band38 filter, the Band40 filter, and the Band41 filter is disposed between a final group of transmit/receive switches Sn and the radio frequency transmission path.

Figure 3:
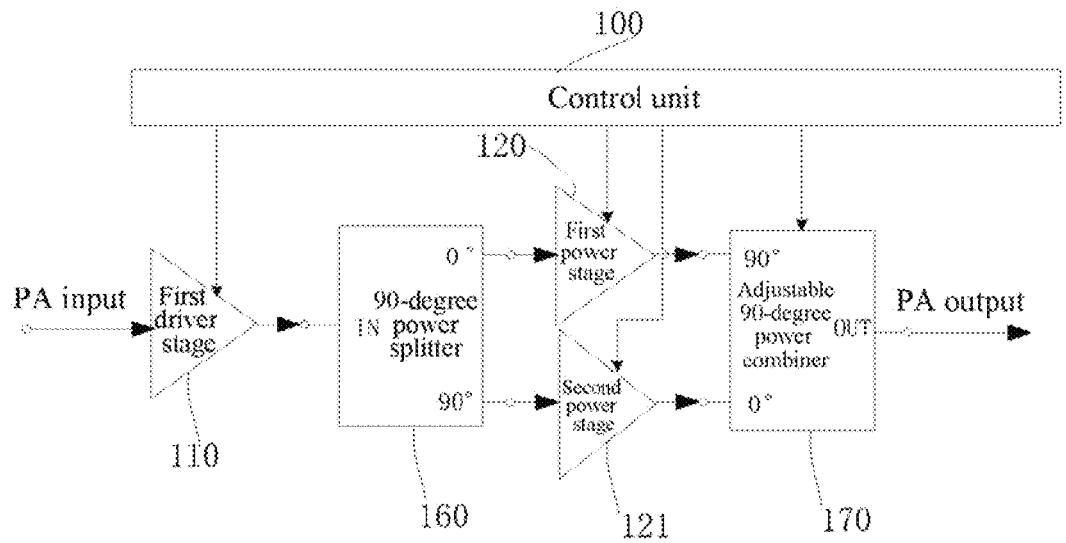
FIG. 3 is a schematic structural diagram 3 of a balanced radio frequency power amplifier according to Embodiment 1 of the present invention.

To facilitate user-defined application of the communication terminal, as shown in FIG. 3, the switch module unit 130 in this embodiment may be further removed, and the two equal-amplitude radio frequency input signals may be synthesized by the adjustable 90-degree power combiner unit 170 into one radio frequency input signal to be directly inputted to the specified radio frequency transmission path, and then inputted to the next-stage circuit.

Embodiment 2

Figure 4:
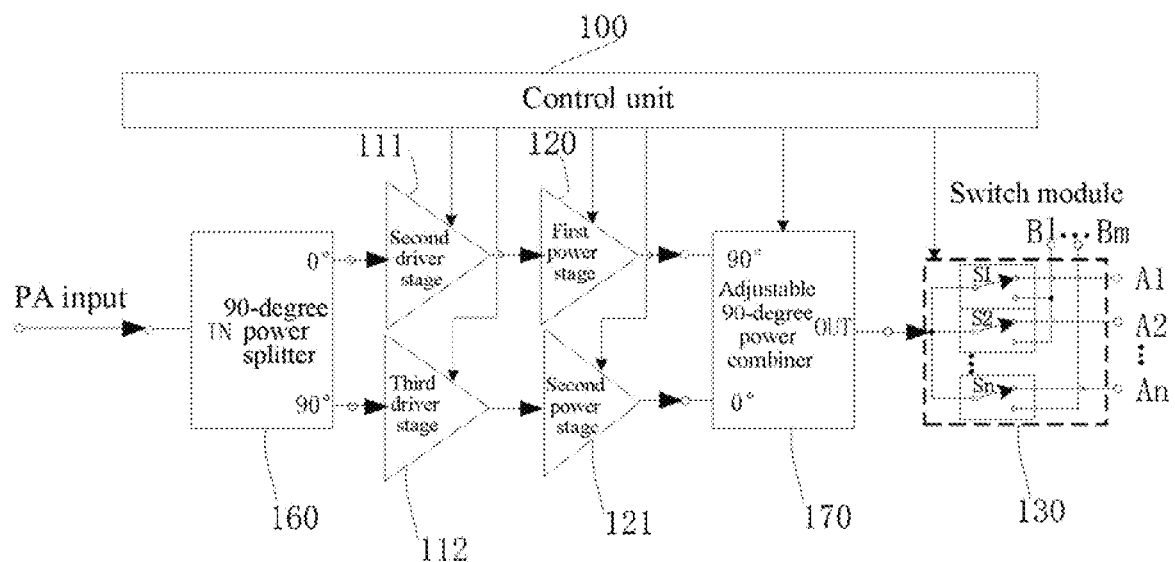
FIG. 4 is a schematic structural diagram 1 of a balanced radio frequency power amplifier according to Embodiment 2 of the present invention.

As shown in FIG. 4, a difference between a balanced radio frequency power amplifier provided in this embodiment and the balanced radio frequency power amplifier provide in Embodiment 1 is that the 90-degree power splitter unit 160 is disposed in front of the first driver stage unit 110, and the first driver stage unit 110 replaced with a second driver stage unit 111 and a third driver stage unit 112. Therefore, the input end of the 90-degree power splitter unit 160 is connected to the radio frequency signal input end, the output end of the 90-degree power splitter unit 160 is correspondingly connected to input ends of the second driver stage unit 111 and the third driver stage unit 112, and output ends of the second driver stage unit 111 and the third driver stage unit 112 are correspondingly connected to input ends of the first power stage unit 120 and the second power stage unit 121. The same part between the balanced radio frequency power amplifier provided in this embodiment and the balanced radio frequency power amplifier provide in Embodiment 1 is not described again. As described in Embodiment 1, a first matching network may be disposed in the 90-degree power splitter unit, and a second matching network may be disposed in the adjustable 90-degree power combiner unit 170.

When a radio frequency input signal enters the balanced radio frequency power amplifier, the radio frequency input signal is inputted to the 90-degree power splitter unit 160 through the radio frequency signal input end, the 90-degree power splitter unit 160 divides the radio frequency input signal into two equal-amplitude radio frequency input signals that have a phase difference of 90 degrees, correspondingly inputs the two equal-amplitude radio frequency input signals to the second driver stage unit 111 and the third driver stage unit 112 to amplify, correspondingly inputs the two equal-amplitude radio frequency input signals that are amplified by the second driver stage unit 111 and the third driver stage unit 112 to the first power stage unit 120 and the second power stage unit 121 to further amplify, correspondingly inputs the two equal-amplitude radio frequency input signals to the adjustable 90-degree power combiner unit 170, and controls the adjustable 90-degree power combiner unit 170 by using the control unit 100, so that when a phase difference of the two equal-amplitude radio frequency input signals at different frequencies changes to 0 degrees or approximately 0 degrees, and an amplitude difference is 0 dBc or approximately 0 dBc, the two radio frequency input signals are synthesized into one radio frequency input signal to be inputted to the switch module unit 130. In this case, the control unit 100 control a switch state of the switch module unit 130 according to a frequency band requirement, and inputs the synthesized radio frequency input signal to a next-stage circuit through a specified radio frequency transmission path.

Figure 5:
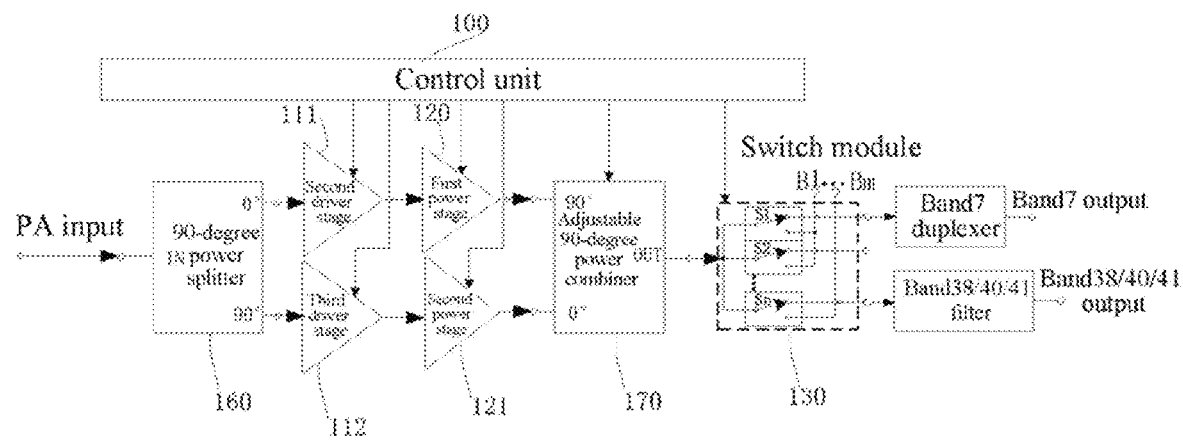
FIG. 5 is a schematic structural diagram 2 of a balanced radio frequency power amplifier according to Embodiment 2 of the present invention.

Similarly, to reduce a package size of the balanced radio frequency power amplifier, optimize a match between integrated filter devices, and simplify a design of a communication terminal, any one of a Band1 duplexer, a Band38 filter, a Band40 filter, and a Band41 filter may be disposed between the switch module unit 130 and the radio frequency transmission path in this embodiment. For example, as shown in FIG. 5, the Band1 duplexer may be disposed between a first group of transmit/receive switches S1 and the radio frequency transmission path, and any one of the Band38 filter, the Band40 filter, and the Band41 filter is disposed between a final group of transmit/receive switches Sn and the radio frequency transmission path.

Figure 6:
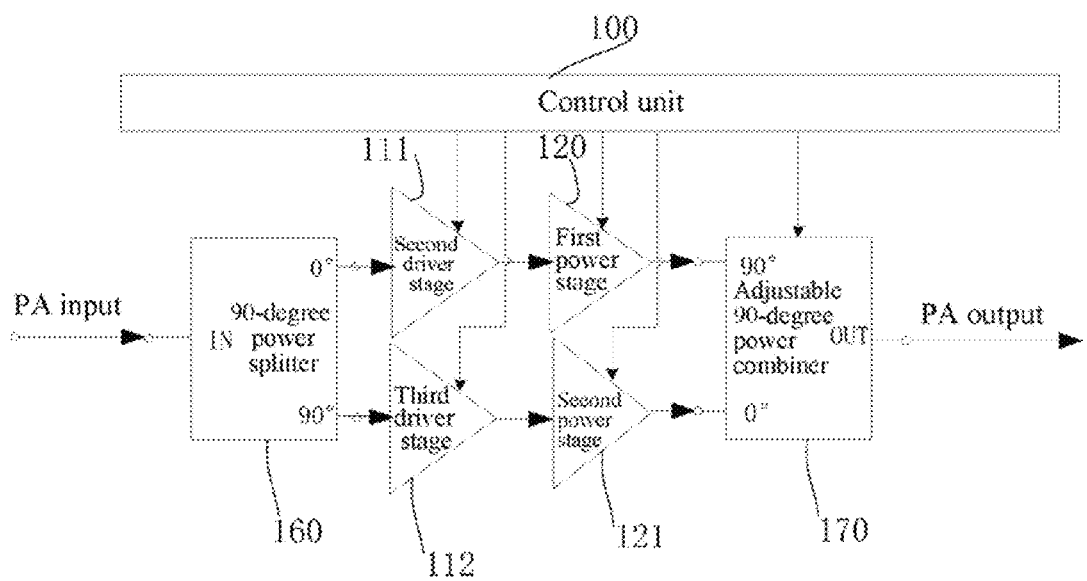
FIG. 6 is a schematic structural diagram 3 of a balanced radio frequency power amplifier according to Embodiment 2 of the present invention.

To facilitate user-defined application of the communication terminal, as shown in FIG. 6, the switch module unit 130 in this embodiment may be further removed, and the two equal-amplitude radio frequency input signals may be synthesized by the adjustable 90-degree power combiner unit 170 into one radio frequency input signal to be directly inputted to the specified radio frequency transmission path, and then inputted to the next-stage circuit.

In addition, the first driver stage unit 110, the second driver stage unit 111, and the third driver stage unit 112 in Embodiment 1 and Embodiment 2 may be single-stage driver stage units or two-stage driver stage units. The first power stage unit 120 and the second power stage unit 121 may be single-stage power stage units or two-stage power stage units. In addition, the first power stage unit 120 and the second power stage unit 121 may be heterojunction bipolar transistors (HBTs) or high electron mobility transistors (HEMTs) or pseudomorphic high electron mobility transistors (pHEMTs) made on a gallium arsenide (GaAs) substrate or a silicon germanium (SiGe) substrate, or bipolar junction transistors (BJTs), or complementary metal-oxide-semiconductor (CMOS) transistors made on a silicon substrate.

Figure 7:
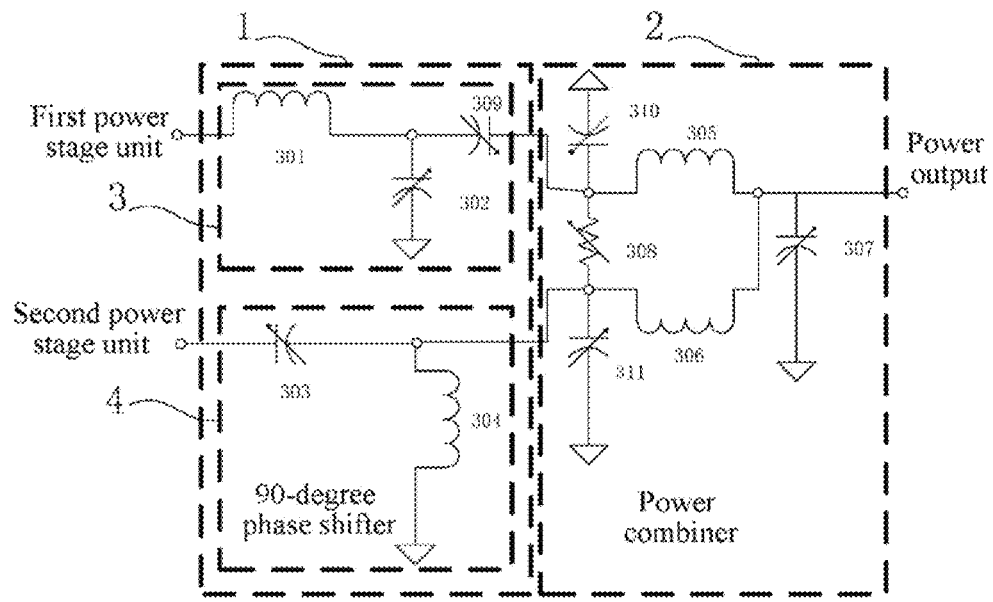
FIG. 7 is a circuit principle diagram of an adjustable 90-degree power combiner in the balanced radio frequency power amplifier according to the present invention.

As shown in FIG. 7, in the balanced radio frequency power amplifier provided in Embodiment 1 and Embodiment 2, the adjustable 90-degree power combiner unit 170 includes a 90-degree phase shifter 1 and a Wilkinson power combiner 2. The 90-degree phase shifter 1 includes a phase lag impedance transformation network 3 and a phase lead impedance transformation network 4. An input end of the phase lag impedance transformation network 3 is connected to the output end of the first power stage unit 120, an output end of the phase lag impedance transformation network 3 is connected to one input end of the Wilkinson power combiner 2, an input end of the phase lead impedance transformation network 4 is connected to the output end of the second power stage unit 121, and an output end of the phase lead impedance transformation network 4 is connected to the other input end of the Wilkinson power combiner 2. The two equal-amplitude radio frequency input signals that have the phase difference of 90 degrees and that are amplified by the first power stage unit 120 and the second power stage unit 121 enter the phase lag impedance transformation network 3 and the phase lead impedance transformation network 4 respectively according to a phase relationship between the two equal-amplitude radio frequency input signals, so that after the phase difference between the two equal-amplitude radio frequency input signals changes to 0 degrees and the amplitude difference is close to (equal to or approximately equal to) 0 dBc at different frequencies, the two equal-amplitude radio frequency input signals are inputted to the Wilkinson power combiner 2. The Wilkinson power combiner 2 synthesizes the two equal-amplitude radio frequency input signals that have the phase difference of 0 degrees and the amplitude difference close to (equal to or approximately equal to) 0 dBc into one radio frequency input signal to be inputted to the switch module unit 130, or directly inputted to the specified radio frequency transmission path.

As shown in FIG. 7, the phase lag impedance transformation network 3 includes a first inductor 301, a first variable capacitor 302, and a second variable capacitor 309. One end of the first inductor 301 is used as the input end of the phase lag impedance transformation network 3, to be connected to the output end of the first power stage unit 120, the other end of the first inductor 301 is separately connected to one end of the first variable capacitor 302 and one end of the second variable capacitor 309, the other end of the first variable capacitor 302 is grounded, and the other end of the second variable capacitor 309 is used as the output end of the phase lag impedance transformation network 3, to be connected to one input end of the Wilkinson power combiner 2. The phase lead impedance transformation network 4 includes a third variable capacitor 303 and a second inductor 304. One end of the third variable capacitor 303 is used as the input end of the phase lead impedance transformation network 4, to be connected to the output end of the second power stage unit 121, the other end of the third variable capacitor 303 is used as the output end of the phase lead impedance transformation network 4, to be separately connected to one end of the second inductor 304 and the other input end of the Wilkinson power combiner 2, and the other end of the second inductor 304 is grounded. The Wilkinson power combiner 2 includes a fourth variable capacitor 310, a variable resistor 308, a fifth variable capacitor 311, a third inductor 305, a fourth inductor 306, and a sixth variable capacitor 307. One end of the fourth variable capacitor 310 is used as one input end of the Wilkinson power combiner 2, to be separately connected to the output end of the phase lag impedance transformation network 3, the other end of the variable resistor 308, and one end of the third inductor 305; one end of the variable resistor 308 is used as the other input end of the Wilkinson power combiner 2, to be separately connected to the output end of the phase lead impedance transformation network 4, one end of the fifth variable capacitor 311, and one end of the fourth inductor 306; the other end of the third inductor 305 and the other end of the fourth inductor 306 are used as the output ends of the adjustable 90-degree power combiner unit 170, to be respectively connected to one end of the sixth variable capacitor 307 and the input end of the switch module unit 130; and the other ends of the fourth variable capacitor 310, the fifth variable capacitor 311, and the sixth variable capacitor 307 are separately grounded.

Figure 8:
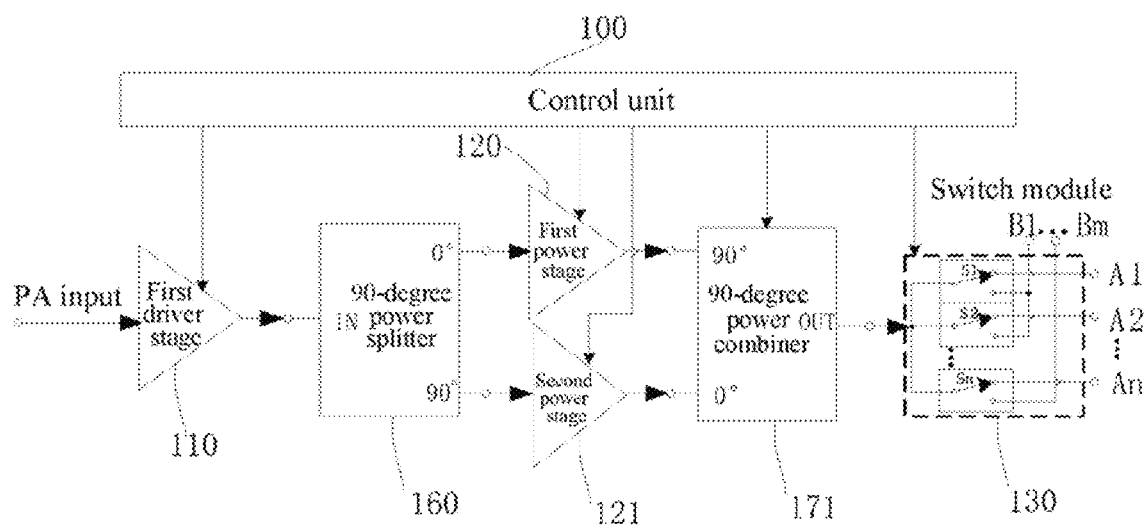
FIG. 8 is a schematic structural diagram of replacing an adjustable 90-degree power combiner unit with a 90-degree power combiner unit with a non-adjustable structure in the balanced radio frequency power amplifier according to the present invention.

Therefore, according to different frequency values, the control unit 100 changes values of a plurality of variable capacitors and variable resistors in the adjustable 90-degree power combiner unit 170, so that the adjustable 90-degree power combiner can maintain the phase difference between the two equal-amplitude radio frequency input signals that have the phase difference of 90 degrees at different frequencies at 0 degrees, and the amplitude difference close to (equal to or approximately equal to) 0 dBc. According to actual design requirements, the variable capacitors in the adjustable 90-degree power combiner unit 170 may be replaced with fixed capacitors, and the variable resistors may be replaced with fixed resistors, that is, non-adjustable structures (as shown in FIG. 8, the adjustable 90-degree power combiner unit 170 is replaced with a 90-degree power combiner unit 171 with a non-adjustable structure). For example, the 90-degree power combiner unit with a non-adjustable structure may be a matching network and a phase-shift network built by inductors, capacitors and resistance devices, or impedance and phase transformation networks built by metal coupled devices, or impedance and phase transformation networks built for a transmission line network. In addition, to reduce a quantity of devices in the adjustable 90-degree power combiner as many as possible, the variable capacitors in the adjustable 90-degree power combiner may be further combined with a variable capacitor, a fixed capacitor or an inductor nearby.

Figure 9A:
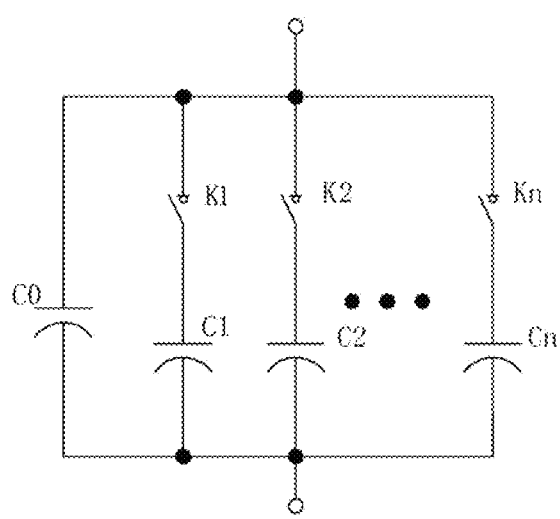
FIG. 9A is a circuit principle diagram of each variable capacitor in an adjustable 90-degree power combiner in the balanced radio frequency power amplifier according to the present invention.

As shown in FIG. 9A, each variable capacitor in the adjustable 90-degree power combiner unit 170 may be formed by parallel connection of a capacitor C0 and n groups of switched capacitor, or independent parallel connection of n groups of switched capacitors. In the n groups of switched capacitors, each group of switched capacitors is formed by series connection of one capacitor and one switch, and switches in the each group of switched capacitors are separately connected to the control unit 100. For example, the group of switched capacitors may be formed by parallel connection of n switched capacitors with the same structures such as a capacitor C1 connected to a switch K1 in series, a capacitor C2 connected to a switch K2 in series . . . and a capacitor Cn connected to a switch Kn in series. The switch K1, the switch K2, . . . and the switch Kn are separately connected to the control unit 100, and the control unit 100 switches a specified quantity of switches in the switch K1 to the switch Kn on or off, to obtain capacitances of corresponding switched capacitors, so as to optimize the phase difference and the amplitude difference between the two radio frequency input signals in the adjustable 90-degree power combiner unit, so that the phase difference between the two radio frequency input signals at different frequencies maintains at 0 degrees, and the amplitude difference is close to (equal to or approximately equal to) 0 dBc. This not only improves the maximum output linear power of the balanced radio frequency power amplifier, but also minimizes the output power of the balanced radio frequency power amplifier along with the change of the load phase.

Figure 9B:
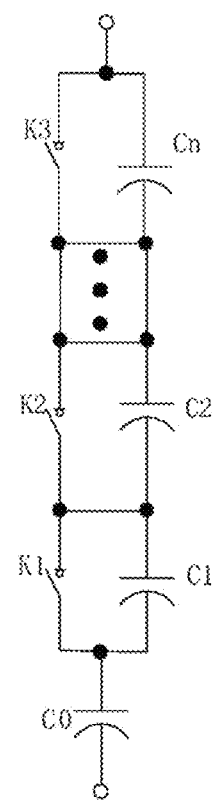
FIG. 9B is another circuit principle diagram of each variable capacitor in the adjustable 90-degree power combiner in the balanced radio frequency power amplifier according to the present invention.

As shown in FIG. 9B, each variable capacitor in the adjustable 90-degree power combiner unit 170 may be further formed by series connection of a capacitor C0 and n groups of switched capacitor, or independent series connection of n groups of switched capacitors. In the n groups of switched capacitors, each group of switched capacitors is formed by parallel connection of one capacitor and one switch, and switches in the each group of switched capacitors are separately connected to the control unit 100. For example, the group of switched capacitors may be formed by series connection of n switched capacitors with the same structures such as a capacitor C1 connected to a switch K1 in parallel, a capacitor C2 connected to a switch K2 in parallel . . . and a capacitor Cn connected to a switch Kn in parallel. The switch K1, the switch K2, . . . and the switch Kn are separately connected to the control unit 100, and the control unit 100 switches a specified quantity of switches in the switch K1 to the switch Kn on or off, to obtain capacitances of corresponding switched capacitors, so as to optimize the phase difference and the amplitude difference between the two radio frequency input signals in the adjustable 90-degree power combiner unit, so that the phase difference between the two radio frequency input signals at different frequencies maintains at 0 degrees or approximately 0 degrees, and the amplitude difference is close to (equal to or approximately equal to) 0 dBc. This not only improves the maximum output linear power of the balanced radio frequency power amplifier, but also minimizes the output power of the balanced radio frequency power amplifier along with the change of the load phase.

Figures 10A, 10B:
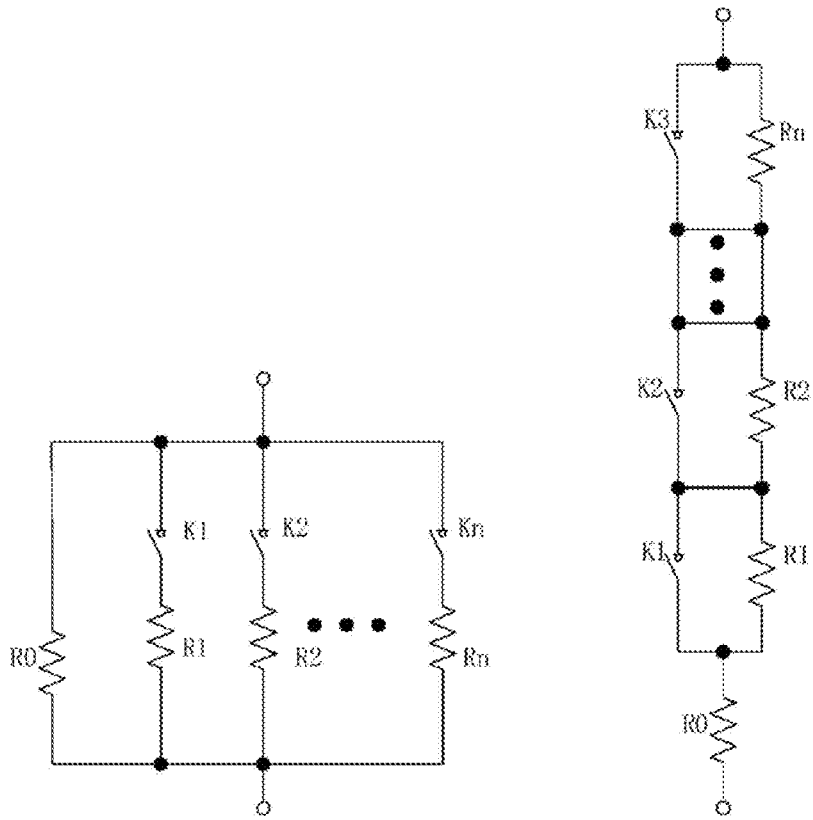
FIG. 10A is a circuit principle diagram of each variable resistor in the adjustable 90-degree power combiner in the balanced radio frequency power amplifier according to the present invention.
FIG. 10B is another circuit principle diagram of each variable resistor in the adjustable 90-degree power combiner in the balanced radio frequency power amplifier according to the present invention.

As shown in FIG. 10A, each variable resistor in the adjustable 90-degree power combiner unit 170 may be formed by parallel connection of a resistor R0 and n groups of switched resistors, or independent parallel connection of n groups of switched resistors. In the n groups of switched resistors, each group of switched resistors is formed by series connection of one resistor and one switch, and switches in the each group of switched resistors are separately connected to the control unit 100. For example, the group of switched resistors may be formed by parallel connection of n switched resistors with the same structures such as a resistor R1 connected to a switch K1 in series, a resistor R2 connected to a switch K2 in series . . . and a resistor Rn connected to a switch Kn in series. The switch K1, the switch K2, . . . and the switch Kn are separately connected to the control unit 100, and the control unit 100 switches a specified quantity of switches in the switch K1 to the switch Kn on or off, to obtain resistances of corresponding switched resistors, so as to optimize the phase difference and the amplitude difference between the two radio frequency input signals in the adjustable 90-degree power combiner unit, so that the phase difference between two radio frequency input signals at different frequencies maintains at 0 degrees or approximately 0 degrees, and the amplitude difference is close to (equal to or approximately equal to) 0 dBc. This not only improves the maximum output linear power of the balanced radio frequency power amplifier, but also minimizes the output power of the balanced radio frequency power amplifier along with the change of the load phase.

As shown in FIG. 9B, each variable resistor in the adjustable 90-degree power combiner unit 170 may be formed by series connection of a resistor R0 and n groups of switched resistors, or independent series connection of n groups of switched resistors. In the n groups of switched resistors, each group of switched resistors is formed by parallel connection of one resistor and one switch, and switches in the each group of switched resistors are separately connected to the control unit 100. For example, the group of switched resistors may be formed by series connection of n switched resistors with the same structures such as a resistor R1 connected to a switch K1 in parallel, a resistor R2 connected to a switch K2 in parallel . . . and a resistor Rn connected to a switch Kn in parallel. The switch K1, the switch K2, . . . and the switch Kn are separately connected to the control unit 100, and the control unit 100 switches a specified quantity of switches in the switch K1 to the switch Kn on or off, to obtain resistances of corresponding switched resistors, so as to optimize the phase difference and the amplitude difference between the two radio frequency input signals in the adjustable 90-degree power combiner unit, so that the phase difference between two radio frequency input signals at different frequencies maintains at 0 degrees or approximately 0 degrees, and the amplitude difference is close to (equal to or approximately equal to) 0 dBc. This not only improves the maximum output linear power of the balanced radio frequency power amplifier, but also minimizes the output power of the balanced radio frequency power amplifier along with the change of the load phase.

Each switch in FIG. 9A to FIG. 10B may be designed on a silicon on insulator (SOI for short) chip, or may be designed on a GaAs chip, or may be designed on a SiGe chip. Each resistor and capacitor in FIG. 9A to FIG. 10B may be designed on an integrated circuit chip, or may be implemented by using a discrete device.

Because frequency bands: Band7 (2.5 GHz to 2.57 GHz), Band38 (2.57 GHz to 2.62 GHz), Band40 (2.3 GHz to 2.4 GHz) and Band41 (2.496 GHz to 2.69 GHz) all fall within a frequency range of 2.3 GHz to 2.69 GHz, the communication terminal integrates all radio frequency power amplifiers in the frequency bands: Band7, Band38, Band40, and Band41 into one integrated circuit chip.

Figure 11:
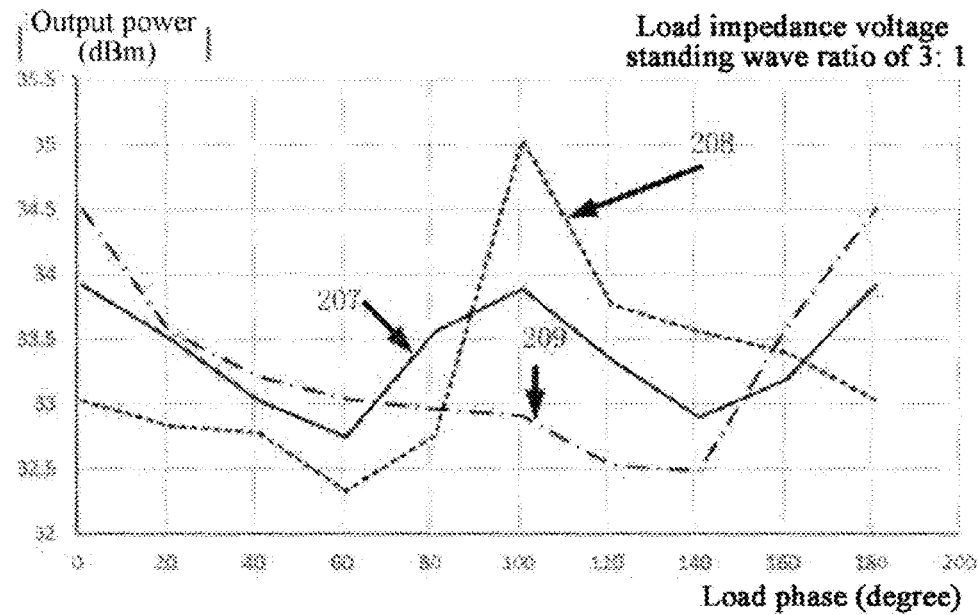
FIG. 11 is a schematic curve diagram that output power (Pout) changes with a load phase in a case that the balanced radio frequency power amplifier according to the present invention is in a load impedance voltage standing wave ratio (VSWR) of 3:1, and phase differences between two radio frequency input signals in the adjustable 90-degree power combiner are respectively 80 degrees, 90 degrees, and 100 degrees.

FIG. 11 shows a curve that output power (Pout) changes with a load phase in a case that the balanced radio frequency power amplifier is in a load impedance voltage standing wave ratio (VSWR) of 3:1, and phase differences between two radio frequency input signals inputted to the adjustable 90-degree power combiner unit 170 are 80 degrees, 90 degrees, and 100 degrees. It can be seen from the figure that, a curve 207 shows that the output power changes with a load phase, and is approximately 1.1 dBc, in a case that the phase difference between the two radio frequency input signals inputted to the adjustable 90-degree power combiner unit 170 maintains at 90 degrees, and the balanced radio frequency power amplifier is in the load impedance VSWR of 3:1. A curve 208 shows that the output power of the balanced radio frequency power amplifier changes with the load phase, and is approximately 2 dBc, in a case that the phase difference between the two radio frequency input signals inputted to the adjustable 90-degree power combiner is reduced to 80 degrees, and the balanced radio frequency power amplifier is in the load impedance VSWR of 3:1. A curve 209 shows that the output power changes with the load phase, and is approximately 2.6 dBc, in a case that the phase difference between the two radio frequency input signals inputted to the adjustable 90-degree power combiner is increased to 100 degrees, and the balanced radio frequency power amplifier is in the load impedance VSWR of 3:1. Therefore, when the adjustable 90-degree power combiner is designed, the output power changes with the load phase minimally in a case that the phase difference between the two radio frequency input signals inputted to the adjustable 90-degree power combiner maintains at 90 degrees, and the balanced radio frequency power amplifier is in the load impedance VSWR of 3:1.

Figure 12:
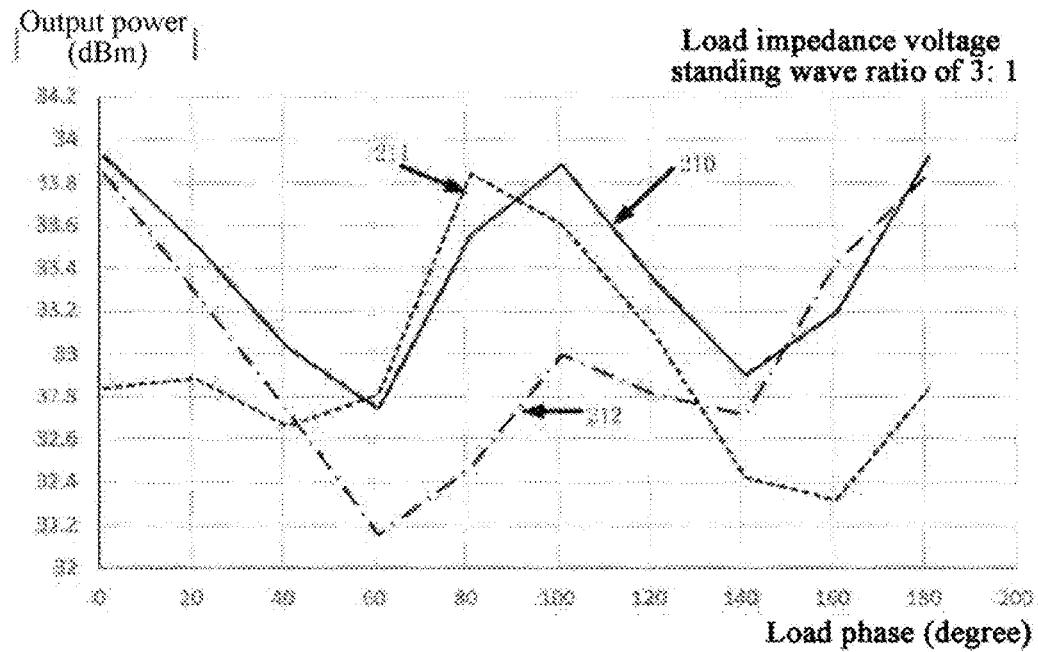
FIG. 12 is a schematic curve diagram that output power (Pout) changes with a load phase in a case that the balanced radio frequency power amplifier according to the present invention is in a load impedance VSWR of 3:1, and magnitude differences between two radio frequency input signals in the adjustable 90-degree power combiner are respectively −1 dBc, 0 dBc, and +1 dBc.

FIG. 12 shows a curve that output power (Pout) changes with a load phase in a case that the balanced radio frequency power amplifier is in a load impedance VSWR of 3:1, and amplitude differences between two radio frequency input signals inputted to the adjustable 90-degree power combiner are −1 dBc, 0 dBc, and +1 dBc. It can be seen from the figure that, a curve 210 shows that the output power changes with the load phase, and is approximately 1.1 dBc, in a case that the amplitude difference between the two radio frequency input signals inputted to the adjustable 90-degree power combiner is 0 dBc, and the balanced radio frequency power amplifier is in the load impedance VSWR of 3:1. Curve 211 shows that the output power changes with the load phase, and is approximately 1.4 dBc, in a case that the amplitude difference between the two radio frequency input signals inputted to the adjustable 90-degree power combiner is −1 dBc, and the load impedance VSWR of 3:1. Curve 212 shows that the output power changes with the load phase, and is approximately 1.6 dBc, in a case that the phase difference between the two radio frequency input signals inputted to the adjustable 90-degree power combiner is +1 dBc, and the balanced radio frequency power amplifier is in the load impedance VSWR of 3:1. Therefore, when the adjustable 90-degree power combiner is designed, the output power changes with the load phase minimally in a case that the phase difference between the two radio frequency input signals inputted to the adjustable 90-degree power combiner is reduced to 0 dBc, and the balanced radio frequency power amplifier is in the load impedance VSWR of 3:1.

Based on the foregoing, when the two radio frequency input signals inputted to the adjustable 90-degree power combiner unit 170 has a larger phase difference in 90 degrees or a larger amplitude difference, the output power changes more greatly with the load phase in a case that the radio frequency power amplifier is in the load impedance VSWR of 3:1. Therefore, the balanced radio frequency power amplifier is within the frequency range of 2.3 GHz to 2.69 GHz, the phase difference between the two radio frequency input signals inputted to the adjustable 90-degree power combiner maintains near 90 degrees, and the amplitude difference is close to 0 dBc.

Figure 13:
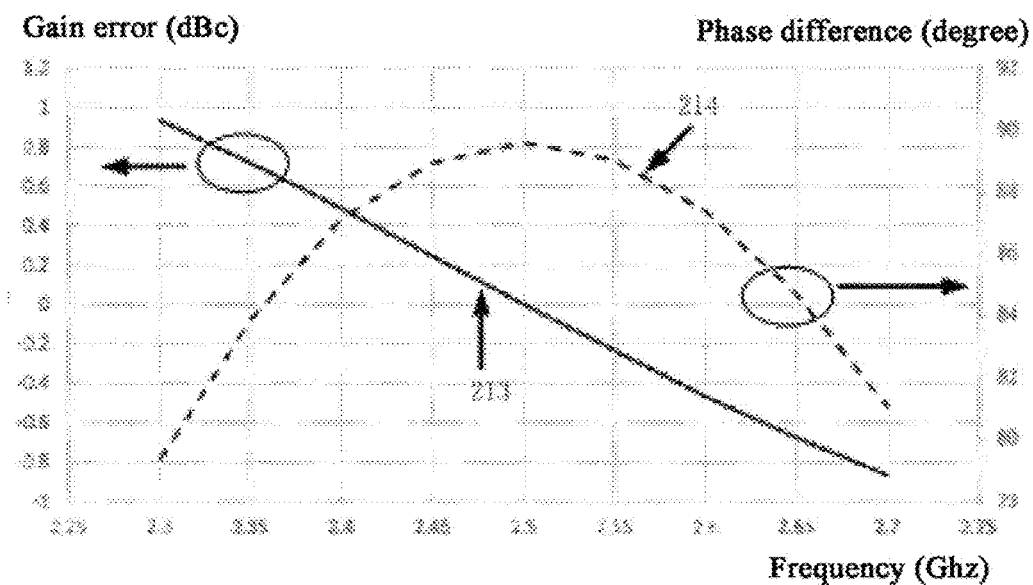
FIG. 13 is a design result of an adjustable 90-degree power combiner whose center frequency band is 2.5 GHz in the balanced radio frequency power amplifier according to the present invention.

As shown in FIG. 13, within the frequency range whose center frequency band is 2.4 GHz to 2.6 GHz, the phase difference between the two radio frequency input signals inputted to the adjustable 90-degree power combiner is 86 degrees (curve 213) to 90 degrees (curve 214), and the amplitude difference is +0.5 dBc to −0.5 dBc. Therefore, the balanced radio frequency power amplifier in the frequency band of Band1 can maintain good performance.

Figure 14:
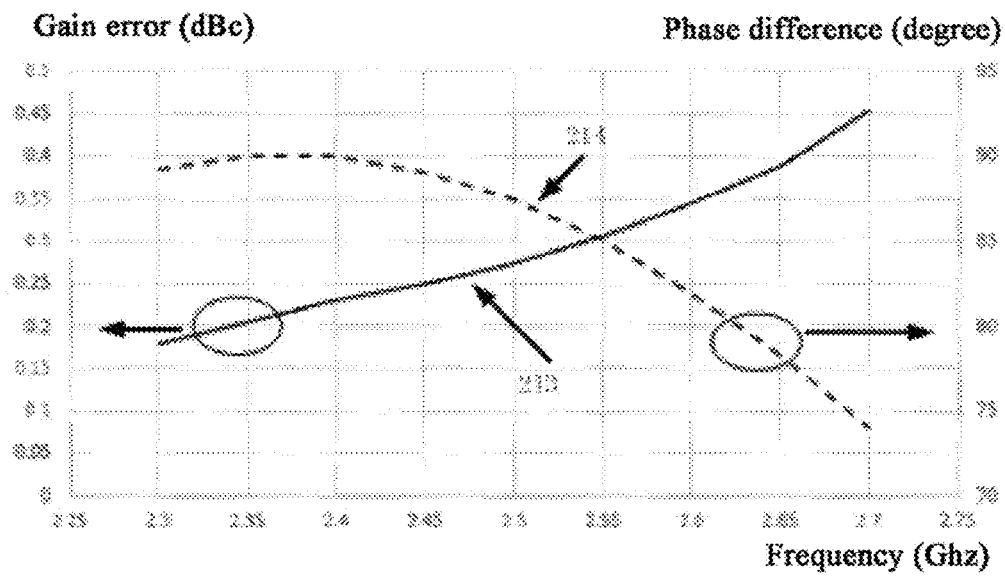
FIG. 14 is a design result of moving a center frequency band to Band40 (2.3 GHz to 2.4 GHz) by changing values of the variable capacitors and the variable resistors in the adjustable 90-degree power combiner in the balanced radio frequency power amplifier according to the present invention.

As shown in FIG. 14, by changing the values of the variable capacitors and the variable resistors in the adjustable 90-degree power combiner, the center frequency band is moved to the frequency range of Band40 (2.3 Ghz to 2.4 Ghz), the phase difference between the two radio frequency input signals inputted to the adjustable 90-degree power combiner is 88 degrees (curve 213) to 90 degrees (curve 214), and the amplitude difference is +0.18 dBc to +0.23 dBc. Therefore, the balanced radio frequency power amplifier in the frequency band of Band40 can maintain good performance.

Figure 15:
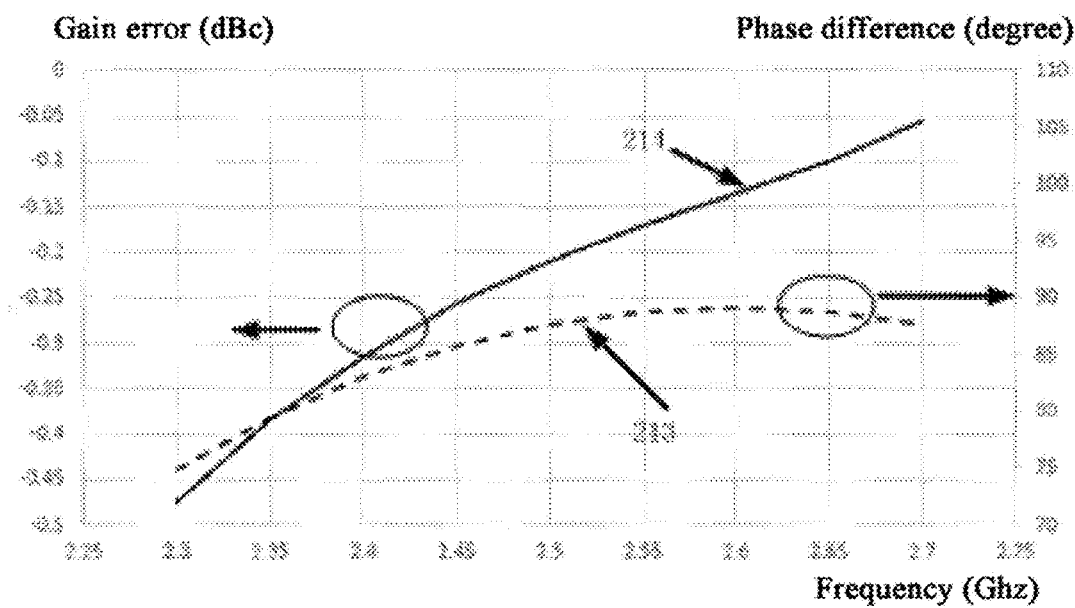
FIG. 15 is a design result of moving a center frequency band to Band41 (2.496 GHz to 2.69 GHz) by changing values of the variable capacitors and the variable resistors in the adjustable 90-degree power combiner in the balanced radio frequency power amplifier according to the present invention.

As shown in FIG. 15, by changing the values of the variable capacitors and the variable resistors in the adjustable 90-degree power combiner, the center frequency band is moved to the frequency range of Band41 (2.496 Ghz to 2.69 Ghz), the phase difference between the two radio frequency input signals inputted to the adjustable 90-degree power combiner is 87 degrees (curve 213) to 89 degrees (curve 214), and the amplitude difference is −0.21 dBc to −0.05 dBc. Therefore, the balanced radio frequency power amplifier in the frequency band of Band38 and the frequency band of Band41 can maintain good performance.

Figure 16:
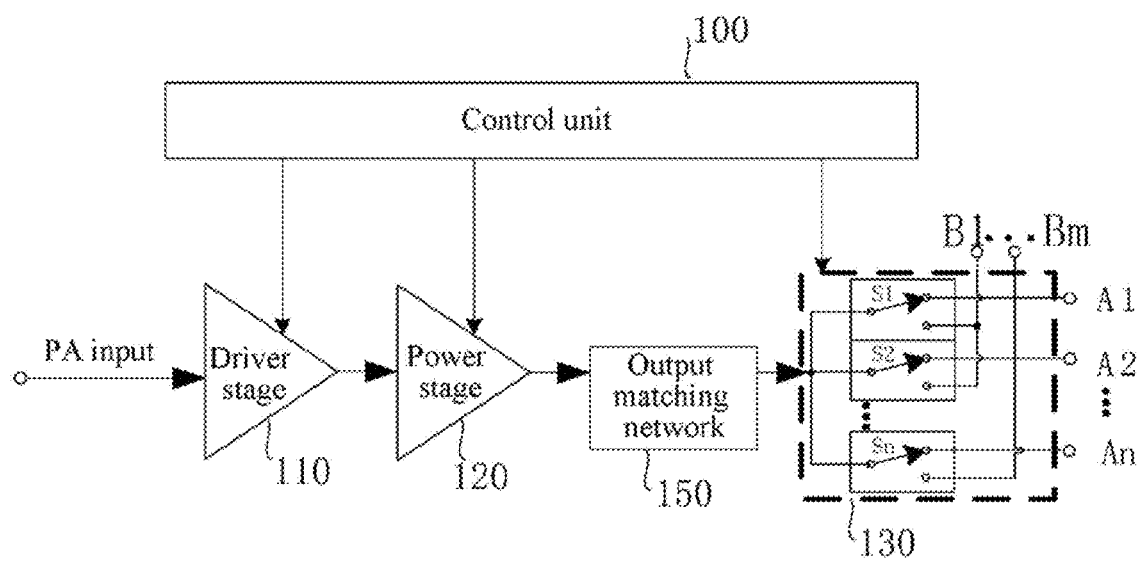
FIG. 16 is a schematic structural diagram of an existing single-end structure radio frequency power amplifier.

As shown in FIG. 16, the existing single-end structure radio frequency power amplifier includes a control unit 100, a driver stage unit 110, a power stage unit 120, an output matching network unit 150, and a switch module unit 130. The control unit 100 is separately connected to the driver stage unit 110, the power stage unit 120, and the switch module unit 130. An input end of the driver stage unit 110 is connected to a radio frequency signal input end, an output end of the driver stage unit 110 is connected to an input end of the power stage unit 120, an output end of the power stage unit 120 is connected to an input end of the output matching network unit 150, and an output end of the output matching network unit 150 is connected to an input end of the switch module unit 130. A received radio frequency input signal is amplified by using the driver stage unit 110, and after being transmitted to the power stage unit 120 to amplify, the received radio frequency input signal is transmitted to the output matching network unit 150. The output matching network unit 150 participates in impedance transformation and suppression of harmonic energy in the radio frequency input signal, and transmits the radio frequency input signal to the switch module unit 130, and the control unit 100 controls a switch state of the switch module unit 130 according to a frequency band requirement, so that the radio frequency input signal is inputted to a next-stage circuit through a specified radio frequency transmission path. The advantage of the single-end structure radio frequency power amplifier is the simple structure, but it is difficult to meet a maximum linear power requirement proposed by the HPUE. In addition, when a load of the radio frequency antenna of the communication terminal changes greatly, the maximum linear power of the single-end structure radio frequency power amplifier also changes greatly. The performance of the balanced radio frequency power amplifier is compared with that of the existing single-end structure radio frequency power amplifier by using FIG. 17 and FIG. 18 below.

It is well known that, situations of the radio frequency antenna of the communication terminal are quite complex. For example, in different holding manners of a mobile phone, the load phase of the radio frequency antenna changes greatly. The communication protocol has clear requirements for the maximum linear power of the communication terminal. For example, in the frequency band of Band1, and in a standard of a power class of 3 (PC3), the maximum output linear power of the antenna of the communication terminal is not less than 23 dBm. Therefore, the communication terminal needs to output the maximum linear power that meets the requirement on condition that the load phase of the radio frequency antenna changes greatly.

Figure 17:
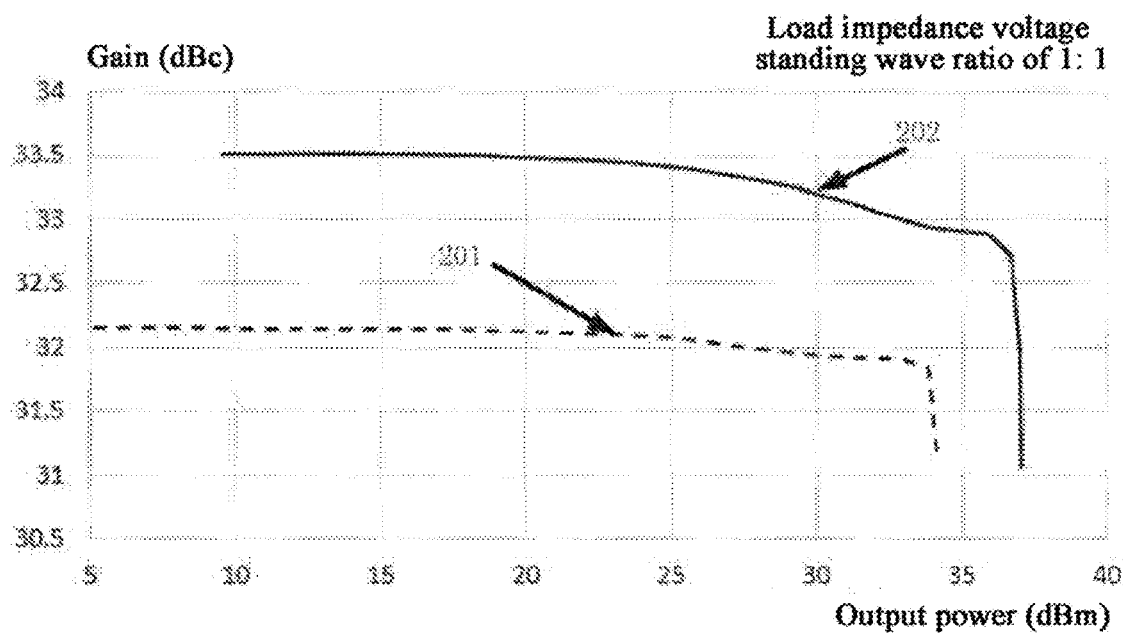
FIG. 17 is a schematic curve diagram of a gain comparison between the existing single-end structure radio frequency power amplifier and the balanced radio frequency power amplifier according to the present invention.

FIG. 17 shows a curve of a gain comparison between the existing single-end structure radio frequency power amplifier and the balanced radio frequency power amplifier in a case that the balanced radio frequency power amplifier is in a load of 500 hm. Because the existing single-end structure radio frequency power amplifier shown in curve 201 only has a single power stage amplification unit, the maximum output linear power of the single-end structure radio frequency power amplifier is 34 dBm (2.51 watts). Because the balanced radio frequency power amplifier shown in curve 202 has two power stage amplification units, the maximum output linear power of the balanced radio frequency power amplifier is 37 dBm (5.01 watts), and is close to two times that of the existing single-end structure radio frequency power amplifier. Therefore, the balanced radio frequency power amplifier relative to the existing single-end structure radio frequency power amplifier can better support the linear power requirement of the mobile HPUE function.

Figure 18:
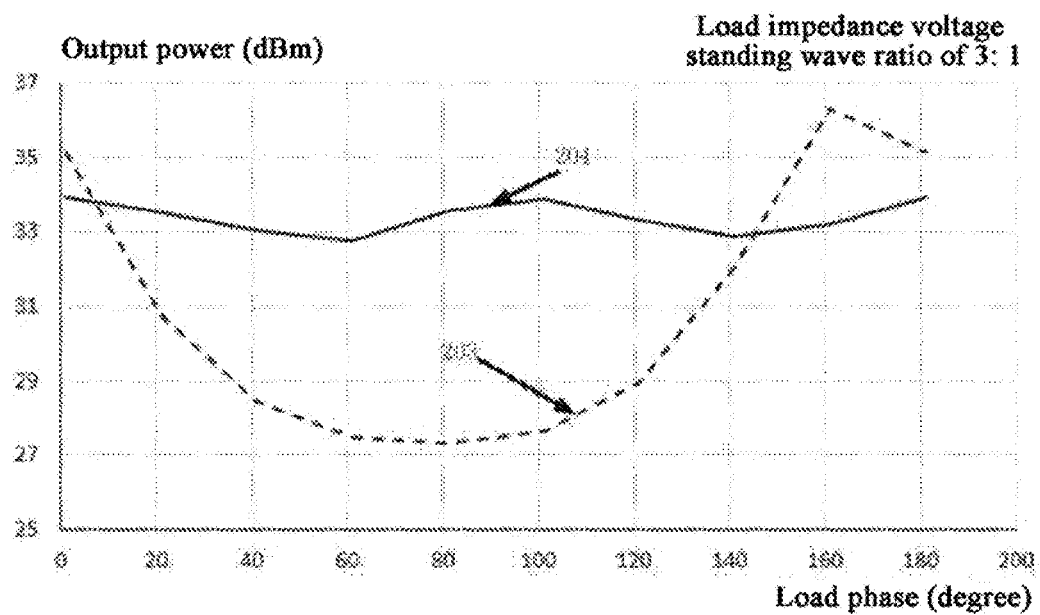
FIG. 18 is a schematic curve diagram of an output power (Pout) comparison between the existing single-end structure radio frequency power amplifier and the balanced radio frequency power amplifier according to the present invention in a case that a load impedance voltage standing wave ratio (VSWR) is 3:1.

As shown in FIG. 18, curve 203 shows a relationship between a maximum output linear power and a load phase of the radio frequency antenna in a case that that the existing single-end structure radio frequency power amplifier is in a load impedance VSWR of 3:1. When the load phase of the radio frequency antenna is 80 degrees, the maximum linear power outputted by the existing single-end structure radio frequency power amplifier is 27. 2 dBm, and when the load phase of the radio frequency antenna is 160 degrees, the maximum linear power outputted by the existing single-end structure radio frequency power amplifier is 36.4 dBm. Therefore, a load phase change of the radio frequency antenna causes a maximum linear power change of 9.2 dBm. When the load phase of the radio frequency antenna is 60 degrees, the maximum linear power outputted by the existing single-end structure radio frequency power amplifier is 32.9 dBm, and when the load phase of the radio frequency antenna is 100 degrees, the maximum linear power outputted by the existing single-end structure radio frequency power amplifier is 33.8 dBm. Therefore, a load impedance change of the radio frequency antenna causes a maximum linear power change of 0.9 dBm. Curve 204 shows a relationship between a maximum output linear power and a load phase of the radio frequency antenna in a case that that the balanced radio frequency power amplifier is in a load impedance VSWR of 3:1. When the load of the radio frequency antenna changes, a maximum output linear power change of the balanced radio frequency power amplifier is far less than a maximum output linear power change of the existing single-end structure radio frequency power amplifier. In the load phase changes of different radio frequency antennas, a minimum saturation power of the balanced radio frequency power amplifier is far greater than that of the existing single-end structure radio frequency power amplifier.

Figure 19:
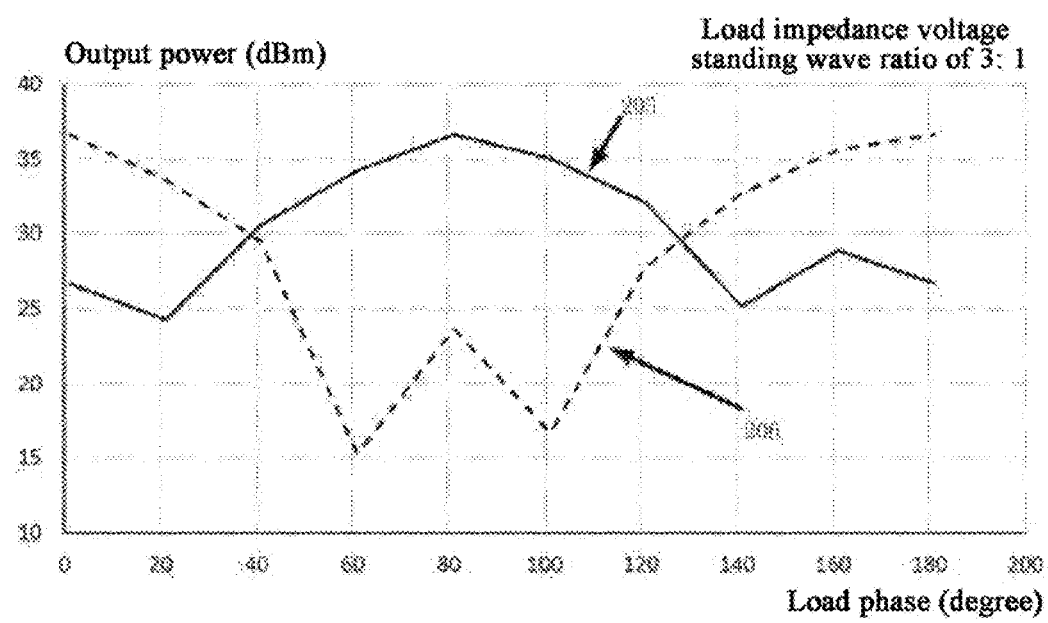
FIG. 19 is a schematic curve diagram of an output power (Pout) comparison between a first power stage unit and a second power stage unit in a case that the balanced radio frequency power amplifier according to the present invention is in a load impedance VSWR of 3:1.

As shown in FIG. 19, when the load of the radio frequency antenna changes, loads of the first power stage unit 120 and the second power stage unit 121 of the balanced radio frequency power amplifier also change. Because the 90-degree power splitter unit divides the radio frequency input signal into two equal-amplitude radio frequency input signals that have a phase difference of 90 degrees, load change trends of the first power stage unit 120 and the second power stage unit 121 are opposite, causing that change trends of maximum output linear powers of the first power stage unit 120 and the second power stage unit 121 are opposite. Curve 205 is a curve of a maximum linear power outputted by the first power stage unit 120 of the balanced radio frequency power amplifier at the load phases of different radio frequency antennas. Curve 206 is a curve of a maximum linear power outputted by the second power stage unit 121 of the balanced radio frequency power amplifier at the load phases of different radio frequency antennas. When the load phase is between 0 degrees and 60 degrees, curve 205 rises, and curve 206 declines. When the load phase is between 60 degrees and 100 degrees, curve 205 is in a high power section, and curve 206 is in a low power section. When the load phase is between 100 degrees and 180 degrees, curve 205 declines, and curve 206 rises. Because change trends of curve 205 and curve 206 at the load phase between 0 degrees and 180 degrees are opposite, an overlay result of the maximum output linear powers of the first power stage unit 120 and the second power stage unit 121 does not change greatly, thereby implementing the characteristics that the balanced radio frequency power amplifier is not sensitive to the load of the radio frequency antenna.

The balanced radio frequency power amplifier provided in the present invention divides, by using a 90-degree power splitter unit, a radio frequency input signal into two equal-amplitude signals that have a phase difference of 90 degrees, the two equal-amplitude radio frequency input signals are inputted to an adjustable 90-degree power combiner unit after being amplified, and a control unit controls values of adjustable capacitors and adjustable resistors in the adjustable 90-degree power combiner, so that when a phase difference of the two radio frequency input signals at different frequencies changes to 0 degrees or approximately 0 degrees, and an amplitude difference is approximately 0 degrees, the two radio frequency input signals are synthesized into one radio frequency input signal to be inputted to a next-stage circuit through a specified radio frequency transmission path. Therefore, the balanced radio frequency power amplifier not only improves a maximum linear power of an output, but also reduces the sensitivity to a load change of a radio frequency antenna, thereby implementing support on a mobile HPUE function.

The balanced radio frequency power amplifier provided in the present invention may be applied to a power amplifier circuit modules of a plurality of modulation signals. The modulation signals include, but are not limited to Wideband Code Division Multiple Access (WCDMA), Time Division-Synchronous Code Division Multiple Access (TD-SCDMA), Code Division Multiple Access (CDMA) 2000, Long Term Evolution (LTE), and WiFi. The balanced radio frequency power amplifier may alternatively be applied to frequency bands of different standards, which are Band1, Band38, Band40, and Band41 currently, or may be applied to 5G frequency bands, for example, Band42 and Band43.

The balanced radio frequency power amplifier provided in the present invention may alternatively be applied to an integrated circuit chip. For a specific structure of the balanced radio frequency power amplifier in the integrated circuit chip, details are not described one by one herein again.

In addition, the balanced radio frequency power amplifier may alternatively be applied to a communication terminal, and is used as an important component of the radio frequency integrated circuit. The communication terminal described herein is a computer device that may be used in a mobile environment, and supports a plurality of communication standards such as Global system for mobile communications (GSM), Enhanced Data rates for GSM Evolution (EDGE), Time Division-Synchronous Code Division Multiple Access (TD-SCDMA), Time Division Long Term Evolution (TDD-LTE), and Frequency Division Duplexing-Long Term Evolution (FDD-LTE). The computer device includes a mobile phone, a notebook computer, a tablet computer, a vehicle-mounted computer, or the like. In addition, the technical solution provided in the present invention is also applicable to application scenarios of other radio frequency integrated circuits, for example, a communication base station.

The balanced radio frequency power amplifier, the chip, and the communication terminal provided in the present invention are described above in detail. Any obvious modification made by a person of ordinary skill in the art falls within the protection scope of the patent of the present invention without departing from the essence of the present invention.

What is claimed is:

1. A balanced radio frequency power amplifier, comprising: a control unit, a first driver stage unit, a 90-degree power splitter unit, a first power stage unit, a second power stage unit, and an adjustable 90-degree power combiner unit, wherein the control unit is separately connected to the first driver stage unit, the first power stage unit, the second power stage unit, and the adjustable 90-degree power combiner unit, an input end of the first driver stage unit is connected to a radio frequency signal input end, an output end of the first driver stage unit is connected to an input end of the 90-degree power splitter unit, an output end of the 90-degree power splitter unit is separately connected to input ends of the first power stage unit and the second power stage unit, output ends of the first power stage unit and the second power stage unit are separately connected to an input end of the adjustable 90-degree power combiner unit, and an output end of the adjustable 90-degree power combiner unit is connected to a radio frequency transmission path;

a switch module unit is disposed between the adjustable 90-degree power combiner unit and the radio frequency transmission path, an input end of the switch module unit is connected to the output end of the adjustable 90-degree power combiner unit, and an output end of the switch module unit is separately connected to the radio frequency transmission path and a radio frequency receiving path, the switch module unit comprises n groups of transmit/receive switches, common ends of each group of transmit/receive switches are separately connected to the output end of the adjustable 90-degree power combiner unit, one output end of the each group of transmit/receive switches is respectively connected to a corresponding radio frequency transmission path, and the other output end of the each group of transmit/receive switches is respectively connected to a corresponding radio frequency receiving path; and a radio frequency input signal is inputted to the 90-degree power splitter unit after being amplified by the first driver stage unit, and the 90-degree power splitter unit divides the radio frequency input signal into two equal-amplitude radio frequency input signals that have a phase difference of 90 degrees, correspondingly inputs the two equal-amplitude radio frequency input signals to the first power stage unit and the second power stage unit to amplify, inputs the two equal-amplitude radio frequency input signals to the adjustable 90-degree power combiner unit, and controls the adjustable 90-degree power combiner unit by using the control unit, so that when the two equal-amplitude radio frequency input signals at different frequencies have a minimum phase difference and a minimum amplitude difference, the two radio frequency input signals are synthesized into one radio frequency input signal to be inputted to the radio frequency transmission path.

2. The balanced radio frequency power amplifier according to claim 1, wherein
the first driver stage unit is replaced with a second driver stage unit and a third driver stage unit, the second driver stage unit and the third driver stage unit are disposed between the 90-degree power splitter unit and the first power stage unit and the second power stage unit, and the input end of the 90-degree power splitter unit is connected to the radio frequency signal input end.

3. The balanced radio frequency power amplifier according to claim 1, wherein
the control unit is connected to the switch module unit, and is configured to: control a switch state of the switch module unit according to a frequency band requirement, and input, through a radio frequency transmission path corresponding to a frequency band, a radio frequency input signal outputted by the adjustable 90-degree power combiner unit to a next-stage circuit.

4. The balanced radio frequency power amplifier according to claim wherein
any one of a Band7 duplexer, a Band38 filter, a Band40 filter, and a Band41 filter is disposed between the switch module unit and the radio frequency transmission path.

5. The balanced radio frequency power amplifier according to claim 1, wherein
the adjustable 90-degree power combiner unit comprises a 90-degree phase shifter and a Wilkinson power combiner, the 90-degree phase shifter comprises a phase lag impedance transformation network and a phase lead impedance transformation network, an input end of the phase lag impedance transformation network is connected to the output end of the first power stage unit, an output end of the phase lag impedance transformation network is connected to one input end of the Wilkinson power combiner, an input end of the phase lead impedance transformation network is connected to the output end of the second power stage unit, and an output end of the phase lead impedance transformation network is connected to the other input end of the Wilkinson power combiner.

6. The balanced radio frequency power amplifier according to claim 5, wherein
the phase lag impedance transformation network comprises a first inductor, a first variable capacitor, and a second variable capacitor, one end of the first inductor is used as the input end of the phase lag impedance transformation network, to be connected to the output end of the first power stage unit, the other end of the first inductor is separately connected to one end of the first variable capacitor and one end of the second variable capacitor, the other end of the first variable capacitor is grounded, and the other end of the second variable capacitor is used as the output end of the phase lag impedance transformation network, to be connected to one input end of the Wilkinson power combiner.

7. The balanced radio frequency power amplifier according to claim 6, wherein
the phase lead impedance transformation network comprises a third variable capacitor and a second inductor, one end of the third variable capacitor is used as the input end of the phase lead impedance transformation network, to be connected to the output end of the second power stage unit, the other end of the third variable capacitor is used as the output end of the phase lead impedance transformation network, to be separately connected to one end of the second inductor and the other input end of the Wilkinson power combiner, and the other end of the second inductor is grounded.

8. The balanced radio frequency power amplifier according to claim 7, wherein
the Wilkinson power combiner comprises a fourth variable capacitor, a variable resistor, a fifth variable capacitor, a third inductor, a fourth inductor, and a sixth variable capacitor, one end of the fourth variable capacitor is used as one input end of the Wilkinson power combiner, to be separately connected to the output end of the phase lag impedance transformation network, the other end of the variable resistor, and one end of the third inductor, one end of the variable resistor is used as the other input end of the Wilkinson power combiner, to be separately connected to the output end of the phase lead impedance transformation network, one end of the fifth variable capacitor, and one end of the fourth inductor, the other end of the third inductor and the other end of the fourth inductor are used as the output ends of the adjustable 90-degree power combiner unit, to be respectively connected to one end of the sixth variable capacitor and the input end of the switch module unit, and the other ends of the fourth variable capacitor, the fifth variable capacitor, and the sixth variable capacitor are separately grounded.

9. The balanced radio frequency power amplifier according to claim 8, wherein
each variable capacitor in the adjustable 90-degree power combiner unit is formed by parallel connection of a capacitor and n groups of switched capacitors, or each variable capacitor in the adjustable 90-degree power combiner unit is formed by parallel connection of n groups of switched capacitors, and n is a positive integer.

10. The balanced radio frequency power amplifier according to claim 9, wherein
in the n groups of switched capacitors, each group of switched capacitors is formed by series connection of one capacitor and one switch, switches in the each group of switched capacitors are separately connected to the control unit, and the control unit switches a specified quantity of switches in the n groups of switched capacitors on or off, to obtain capacitances of corresponding switched capacitors.

11. The balanced radio frequency power amplifier according to claim 8, wherein
each variable capacitor in the adjustable 90-degree power combiner unit is formed by series connection of a capacitor and n groups of switched capacitors, or each variable capacitor in the adjustable 90-degree power combiner unit is formed by series connection of n groups of switched capacitors.

12. The balanced radio frequency power amplifier according to claim 11, wherein
in then groups of switched capacitors, each group of switched capacitors is formed by parallel connection of one capacitor and one switch, switches in each group of switched capacitors are separately connected to the control unit, and the control unit switches a specified quantity of switches in the n groups of switched capacitors on or off, to obtain capacitances of corresponding switched capacitors.

13. The balanced radio frequency power amplifier according to claim 8, wherein
each variable resistor in the adjustable 90-degree power combiner unit is formed by parallel connection of a resistor and n groups of switched resistors, or each variable resistor in the adjustable 90-degree power combiner unit is formed by parallel connection of n groups of switched resistors.

14. The balanced radio frequency power amplifier according to claim 13, wherein
in the n groups of switched resistors, each group of switched resistors is formed by series connection of one resistor and one switch, switches in each group of switched resistors are separately connected to the control unit, and the control unit switches a specified quantity of switches in the n groups of switched resistors on or off, to obtain resistances of corresponding switched resistors.

15. The balanced radio frequency power amplifier according to claim 8, wherein
each variable resistor in the adjustable 90-degree power combiner unit is formed by series connection of a resistor and n groups of switched resistors, or each variable resistor in the adjustable 90-degree power combiner unit is formed by series connection of n groups of switched resistors.

16. The balanced radio frequency power amplifier according to claim 15, wherein
in the n groups of switched resistors, each group of switched resistors is formed by parallel connection of one resistor and one switch, switches in each group of switched resistors are separately connected to the control unit, and the control unit switches a specified quantity of switches in the n groups of switched resistors on or off, to obtain resistances of corresponding switched resistors.

17. An integrated circuit chip, comprising the balanced radio frequency power amplifier according to claim 1.

18. A communication terminal, comprising the balanced radio frequency power amplifier according to claim 1.

* * * * *